United States Patent
Bhagat et al.

(10) Patent No.: US 9,897,677 B2
(45) Date of Patent: Feb. 20, 2018

(54) METHOD FOR CORRECTING ERRORS ASSOCIATED WITH ASYNCHRONOUS TIMING OFFSETS BETWEEN TRANSMIT AND RECEIVE CLOCKS IN MRI WIRELESS RADIOFREQUENCY COILS

(71) Applicant: Samsung Electronics Co., Ltd., Suwon-si, Gyeonggi-do (KR)

(72) Inventors: Yusuf A. Bhagat, Allen, TX (US); Sean Lai, Richardson, TX (US); Insoo Kim, Frisco, TX (US); Ying Dong, Parsippany, NJ (US); Zhouyue Pi, Allen, TX (US); Xu Zhu, Allen, TX (US)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 610 days.

(21) Appl. No.: 14/475,377

(22) Filed: Sep. 2, 2014

(65) Prior Publication Data

US 2015/0066413 A1    Mar. 5, 2015

Related U.S. Application Data

(60) Provisional application No. 61/873,725, filed on Sep. 4, 2013, provisional application No. 61/923,125, filed on Jan. 2, 2014.

(51) Int. Cl.
*G01R 33/565* (2006.01)
*G01R 33/36* (2006.01)
(Continued)

(52) U.S. Cl.
CPC ... *G01R 33/56509* (2013.01); *G01R 33/3692* (2013.01); *G01R 33/583* (2013.01)

(58) Field of Classification Search
CPC .............................. G01R 33/56509
See application file for complete search history.

(56) References Cited

U.S. PATENT DOCUMENTS 6,160,397 A    12/2000  Washburn et al.
6,388,442 B1    5/2002  Uetake et al.
(Continued)

FOREIGN PATENT DOCUMENTS

CN    102177243 A    9/2011
CN    102309323 A    1/2012
(Continued)

OTHER PUBLICATIONS

International Search Report dated Jan. 6, 2015 in connection with International Patent Application No. PCT/KR2014/008337, 3 pages.
(Continued)

*Primary Examiner* — Phuong Huynh

(57) ABSTRACT

A method and apparatus correcting errors associated with timing offsets in radiofrequency coils. The method and apparatus include a memory element and a controller. The controller is configured to execute a set of instructions to receive data of a plurality of signals, the plurality of signals comprising at least one projection echo. The controller is also configured to identify a plurality of offsets of the plurality of signals based on the at least one projection echo. The controller is also configured to apply the plurality of offsets to a k-space of the plurality of signals.

20 Claims, 11 Drawing Sheets

(51) Int. Cl.
   *G06F 11/30*   (2006.01)
   *G01R 33/58*   (2006.01)

(56) References Cited

U.S. PATENT DOCUMENTS

| | | |
|---|---|---|
| 6,424,153 B1 | 7/2002 | Liu et al. |
| 6,445,184 B1 | 9/2002 | Tanttu |
| 6,541,970 B1 * | 4/2003 | Takizawa ......... G01R 33/56554 324/309 |
| 7,235,971 B2 | 6/2007 | Foxall et al. |
| 2011/0227574 A1 | 9/2011 | Akita et al. |
| 2012/0008842 A1 | 1/2012 | Hinks et al. |
| 2012/0286777 A1 | 11/2012 | Frost et al. |
| 2013/0119981 A1 | 5/2013 | Choi et al. |

FOREIGN PATENT DOCUMENTS

| | | |
|---|---|---|
| CN | 102772210 A | 11/2012 |
| JP | 2012085970 A | 5/2012 |

OTHER PUBLICATIONS

Written Opinion of the International Searching Authority dated Jan. 6, 2015 in connection with International Patent Application No. PCT/KR2014/008337, 8 pages.

Bhagat et al.; "Asynchronous Timing Error Offset Identification and Deskews (ASTEROIDS) for Wireless MRI"; 2015 IEEE Global Conference on Signal and Information Processing (GlobalSIP); Orlando, Florida, USA; Dec. 14-16, 2015; 5 pages.

Foreign Communication from Related Counterpart Application; European Patent Application No. 14842154.8; Extended European Search Report dated Jun. 12, 2017; 11 pages.

Foreign Communication from Related Counterpart Application; Chinese Patent Application No. 201480049050.7; First Chinese Office Action dated Jun. 16, 2017; 15 pages.

\* cited by examiner

500
METHOD FOR CORRECTING ERRORS ASSOCIATED WITH ASYNCHRONOUS TIMING OFFSETS BETWEEN TRANSMIT AND RECEIVE CLOCKS IN MRI WIRELESS RADIOFREQUENCY COILS

CROSS-REFERENCE TO RELATED APPLICATION(S) AND CLAIM OF PRIORITY

The present application claims priority to U.S. Provisional Patent Application Ser. No. 61/873,725, filed Sep. 4, 2013, entitled "METHOD FOR CORRECTING ERRORS ASSOCIATED WITH ASYNCHRONOUS TIMING OFFSETS BETWEEN TRANSMIT AND RECEIVE CLOCKS IN MRI WIRELESS RADIOFREQUENCY COILS" and U.S. Provisional Patent Application Ser. No. 61/923,125, filed Jan. 2, 2014, entitled "WIRELESS MRI RADIO FREQUENCY COILS AND PULSE SEQUENCES FOR ON-BOARD PROSPECTIVE MOTION DETECTION AND CORRECTION". The content of the above-identified patent documents are incorporated herein by reference.

TECHNICAL FIELD

The present application relates generally to methods and apparatuses for signal correction and, more specifically, to correct timing between transmit and receive clocks for wireless radiofrequency coils in a magnetic resonance imaging system.

BACKGROUND

Magnetic resonance imaging (MRI) is a modality for evaluating tissue structure and function. Several MRI techniques are routinely used in clinical and research settings to answer questions related to anatomy, physiology and pathology at acute and chronic disease stages. Of the many developmental sub-fields in MRI, one of the more rapidly growing areas concerns multi-channel radio frequency (RF) coils for signal transmission and/or reception. In particular, over the past decade, there has been widespread interest in implementing wireless RF solutions owing to several problems associated with wired RF coils.

Firstly, coaxial cables in wired RF coils impart a level of rigidity to the setup process and restrict the range of motion of both, the transmit-receive (Tx-Rx) and Rx-only coil components during setup. Along these lines, with increasing number of arrays (up to 128 channels), cable management becomes very complex. Baluns are required for each channel and cables must be routed efficiently in order to minimize coil interactions. Secondly, due to the switching of coil components in the course of a routine day on a clinical scanner (given the different anatomical body parts examined), the cables are also subject to induced stress over time compromising their elasticity, leading to increased wear and tear and potentially requiring frequent replacements. Thirdly, coaxial cables can play the role of an antenna capturing external noise and lead to a decrease in signal-to-noise ratio (SNR) of the acquired images. For these main reasons, implementing a wireless mode for the RF subsystem is highly desirable.

SUMMARY

An apparatus is provided for correcting errors associated with timing offsets in radiofrequency coils. The apparatus includes a memory element and a controller. The controller is configured to execute a set of instructions to receive data of a plurality of signals, the plurality of signals comprising at least one projection echo. The controller is also configured to identify a plurality of offsets of the plurality of signals based on the at least one projection echo. The controller is also configured to apply the plurality of offsets to a k-space of the plurality of signals.

A method is provided for correcting errors associated with timing offsets in radiofrequency coils. The method includes receiving data of a plurality of signals, the plurality of signals comprising at least one projection echo. The method also includes identifying a plurality of offsets of the plurality of signals based on at least one projection echo. The method also includes applying the plurality of offsets to a k-space of the plurality of signals.

A non-transitory computer-readable storage medium comprising logic, stored on the computer-readable storage medium for execution on a plurality of processors is provided for correcting errors associated with timing offsets in radiofrequency coils. The logic includes receiving data of a plurality of signals, the plurality of signals comprising at least one projection echo. The logic also includes identifying a plurality of offsets of the plurality of signals based on at least one projection echo. The logic also includes applying the plurality of offsets to a k-space of the plurality of signals.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or method.

Figure 1:
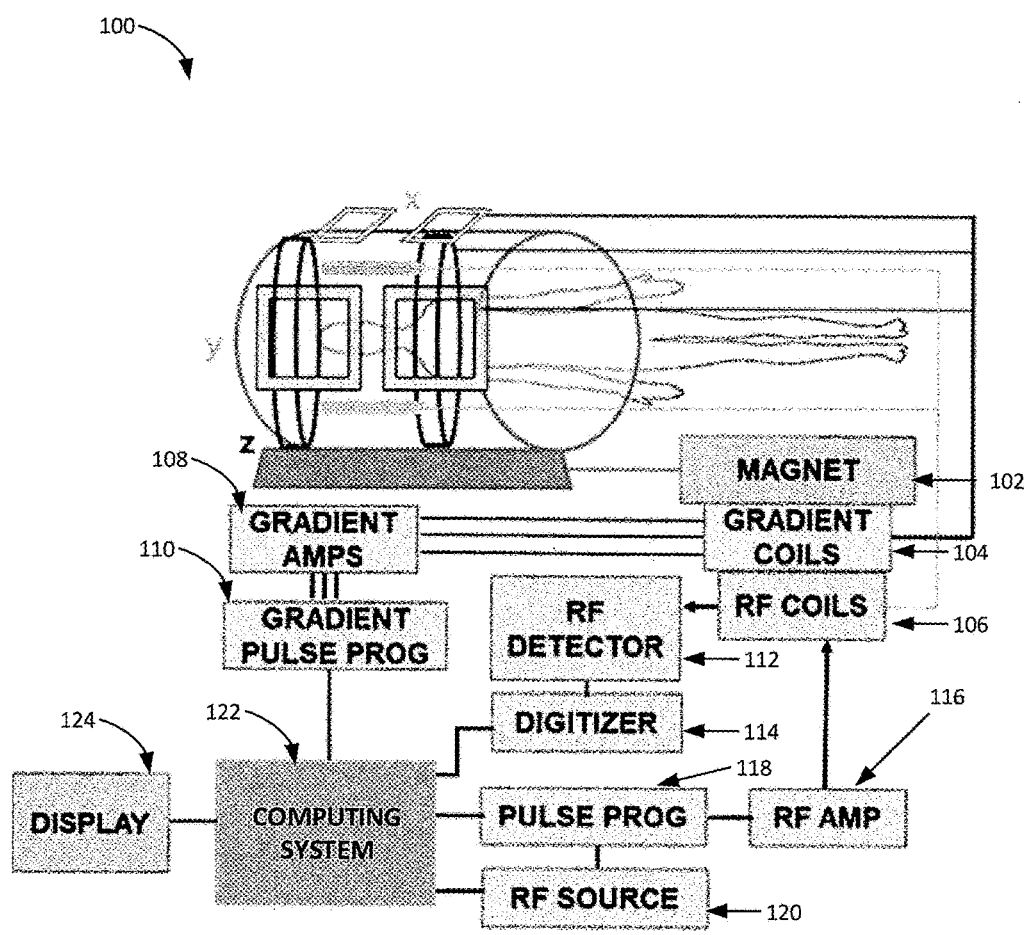
FIG. 1 illustrates an MRI system in accordance with an embodiment of this disclosure.

FIG. 1 illustrates an MRI system in accordance with an embodiment of this disclosure. The MRI system 100 operates a medical imaging technique used in radiology to investigate the anatomy and physiology of the body in both health and disease. MRI scanners use strong magnetic fields and radio waves to form images of the body. The body may be referred to as the tissue, subject, sample, and/or object herein. The MRI system 100 includes components such as a magnet 102, gradient coils 104, RF coils 106, gradient amplifiers 108, a gradient pulse programmer 110, an RF detector 112, a digitizer 114, an RF amplifier 116, a pulse programmer 118, an RF source 120, a computing system 122, and a display 124, as described below. The embodiment of the MRI system 100 shown in FIG. 1 is for illustration only. Other embodiments of an MRI system could be used without departing from the scope of the present disclosure.

The magnet 102 may be an electromagnet (such as a superconducting and/or resistive magnet), permanent magnet, and/or the like. The magnet 102 forms a strong magnetic field around the area to be imaged. In one or more embodiments, in operational terminology, the magnet 102 may be a Helmholtz coil pair driven by a power supply to generate a stable, homogeneous static main magnetic field along the z-axis for polarizing nuclei.

The gradient coils 104 may also be electromagnets (such as a superconducting and/or resistive), permanent magnets, and/or the like. The gradient coils 104 are used to spatially encode the positions of protons by varying the magnetic field linearly across the imaging volume. In one or more embodiments, in operational terminology, three sets of gradient coils 104 driven by gradient field coil drivers create inhomogeneous linear gradient magnetic fields along x, y, and z axes that are used for spatial localization of the MRI signals.

The RF coils 106 may also be used as receiving (Rx) coils, and in an embodiment, depending on the filling factor desired. The RF coils 106 pick up the RF electromagnetic radiation produced by nuclear relaxation inside the subject. The RF coils 106 now operate as a Rx coil given that this phenomenon occurs following excitation (by means of RF coils 106) and signal reception is now performed by the Rx coil which could also serve as a function of the Tx coil, thereby making such as coil a transceiver. The RF coils 106 can serve as Rx and Tx coils. In other embodiments, the Rx and Tx coils may be separated.

In one or more embodiments, in operational terminology, the RF coils 106 which generate time varying and rotating magnetic fields required to excite nuclei and measure MR signals, are positioned within the setup of the magnet 102 and gradient coils 104. The sample under examination is placed within the RF coils 106. The RF amplifier 116 is configured to deposit current into the RF coils 106 behaving as a transmitter which generates an RF field. The RF field applies a torque to the nuclear magnetization of the sample, more specifically, hydrogen molecules in the sample.

The driving time of each of the gradient coils 104 and timing of RF field generation is overseen by the computing system 122 according to a programmed sequence of events by the pulse programmer 118, referred to as a pulse sequence. The RF field can induce an electromotive force (EMF) in RF receiver Rx coils which is sent to a signal processor through a pre-amplifier and phase sensitive detector. The received data are then processed and converted into images. Hence, RF coils can serve the function of nuclear spin excitation and signal reception. The course of signal transmission at excitation leads to amplification of the signal by the power amplifier to several KW and then transmission of the signal to the RF coil. At reception, the detected signal from the sample is amplified by several $\mu V$ by the pre-amplifier and then transmission to the phase sensitive detector. In both cases, signal transmission is traditionally carried out using coaxial cables.

The computing system 122 represents any suitable computing or processing device. The computing system 122 can interact with a server or other computing device(s) over a network. In this example, the computing system 122 can include a desktop computer, a mobile telephone or smartphone, a personal digital assistant (PDA), a laptop computer, and a tablet computer. However, any other or additional Processing device could be used in the MRI system 100.

Although FIG. 1 illustrates one example of an MRI system 100, various changes may be made to FIG. 1. For example, the MRI system 100 could include any number of each component in any suitable arrangement. In general, MRI systems come in a wide variety of configurations, and FIG. 1 does not limit the scope of this disclosure to any particular configuration. While FIG. 1 illustrates one operational environment in which various features disclosed in this patent document can be used, these features could be used in any other suitable system.

The basic hardware components of all MRI systems are the magnet (permanent or superconducting) producing a stable and very intense magnetic field, the gradient coils creating a variable field and to encode spatial positioning, and radio frequency (RF) coils which are used to transmit energy, and to detect material/tissue resonance induced radiated RF signal. A computer controls the MRI scanning operation and processes the information.

RF coils are large inductors (wire or trace looped around the core of the coil) with a considerable dimension and a defined wavelength. Coils are used to create a magnetic field or to detect a changing magnetic field by voltage induced in the wire. A coil is usually a small antenna. RF coils can be differentiated by their function into three general categories: 1) Transmit (Tx)-only, 2) Receive (Rx)-only, and 3) Tx-Rx coils. In MRI, RF coils in different shapes and sizes are used for different body parts and to handle individual applications. Depending on the anatomy of interest, these coils fall into either the volume coil or a surface coil categories. Volume coils comprise birdcages, circularly polarized coils, crossed coils, Helmholtz pair, paired saddle coils and single turn coils. Surface coils consist of phased-arrays, body wrap-around coils and linearly polarized coils. The RF signal is in the range of 10 to 300 MHz deemed to be safe on clinical whole body scanners. During typical clinical imaging scans, the entire frequency spectrum of interest is on the order 10 kHz-1 MHz, which is an extremely narrow band, considering that the center frequency is about 100 MHz.

Figure 2:
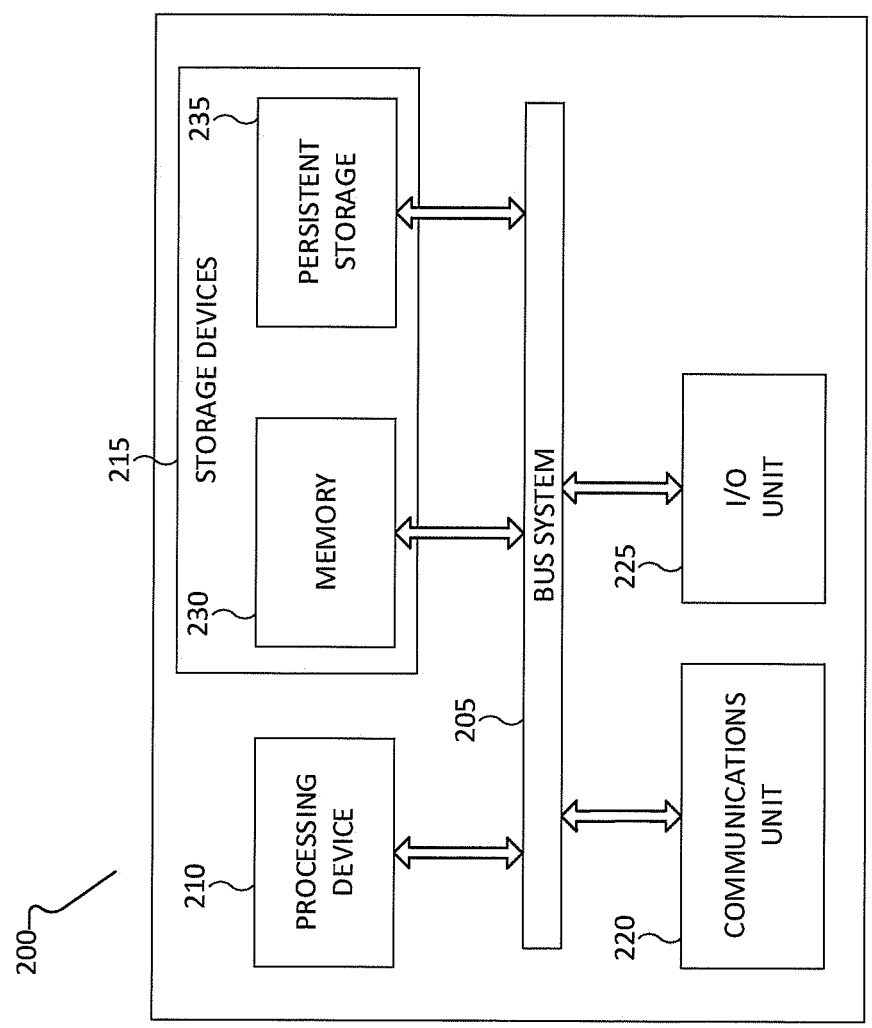
FIG. 2 illustrates an example processing device in a computing system according to this disclosure.

FIG. 2 illustrates an example processing device 210 in a computing system 200 according to this disclosure. The computing system 200 could represent the computing system 122 in FIG. 1.

As shown in FIG. 2, the computing system 200 includes a bus system 205, which supports communication between at least one processing device 210, at least one storage device 215, at least one communications unit 220, and at least one input/output (I/O) unit 225.

The processing device 210 executes instructions that may be loaded into a memory 230. The processing device 210 may include any suitable number(s) and type(s) of processors or other devices in any suitable arrangement. Example types of processing devices 210 include controllers, microprocessors, microcontrollers, digital signal processors, field programmable gate arrays, application specific integrated circuits, and discreet circuitry.

The memory 230 and a persistent storage 235 are examples of storage devices 215, which represent any structure(s) capable of storing and facilitating retrieval of information (such as data, program code, and/or other suitable information on a temporary or permanent basis). The memory 230 may represent a random access memory or any other suitable volatile or non-volatile storage device(s). The persistent storage 235 may contain one or more components or devices supporting longer-term storage of data, such as a ready only memory, hard drive, Flash memory, or optical disc.

The communications unit 220 supports communications with other systems or devices. For example, the communications unit 220 could include a network interface card or a wireless transceiver facilitating communications over a network. The communications unit 220 may support communications through any suitable physical or wireless communication link(s).

The I/O unit 225 allows for input and output of data. For example, the I/O unit 225 may provide a connection for user input through a keyboard, mouse, keypad, touchscreen, or other suitable input device. The I/O unit 225 may also send output to a display, printer, or other suitable output device.

One or more embodiments of this disclosure recognize and take into account that one of the primary challenges in implementing a wireless RF coil solution is synchronization between the RF Tx and Rx signals. Poor synchronization can result in image quality deterioration owing to phase rotation due to frequency mismatch between Tx and Rx clocks. In current systems, the receiver was connected to the MR system clock and the transmitter sent signals wirelessly. Hence, this system does not involve a fully wireless Rx system. An alternative proposal entailed using a bi-directional wireless link where the digitized MR signal was sent from the Rx coil to the MR system and a clock signal was routed in the opposite direction. The system entailed an amplitude modulation transmitter where a 2.4 gigaHertz (GHz) carrier was modulated with 2 megaHertz (MHz) clock sourced from the existing system and an envelope-detection based receiver. Although in this system the phase errors may be low, given that the transmitter clock is inherently noisy, the receiver could become asynchronous. This could lead to random displacements in the nuclear magnetic resonance (NMR) Fourier space or k-space from one line to the next line of each data readout. Such errors may extend beyond the scope of an effective correction. Furthermore, there may be additional k-space errors and resultant image domain artifacts.

Another system is a two-pronged system for transmitting a pilot signal together with the MR signal. One approach here is to broadcast the pilot signal with an offset in frequency but near the free induction decay (FID) frequency. A transponder in the receiver can then up convert the pilot signal along with the FID signal for transmission. The received pilot signal then serves as a phase reference for the image data with pilot phase variations being subtracted in the FID signal. Here, despite the proposed subtractions, phase error accumulation may not be easily resolved, especially in the presence of increasing system noise. Furthermore, the level of system noise could govern the accuracy of the received pilot signals. Inaccuracies here may lead to a shift of k-space locations from one line to the next data readout line and would require an effective post-processing correction. A second transmission approach focuses on up converting the FID and pilot signal by amplitude modulations, with a single side band of the modulated carrier signal being transmitted to the processing unit which recovers both the pilot and FID signal by demodulation. The pilot and FID are then mixed to get a difference signal with phase error cancellation. The difference signal can then be down converted as required to obtain the FID signal. Also, phase error accumulation may not be readily resolved and could result in phase shift that causes blurring across images.

One or more embodiments of this disclosure provide an error correction method that can remedy image artifacts associated with timing offsets between transmit and receive clocks in wireless RF coil setups for MRI scans. Unlike previous systems, this disclosure provides for a non-hardware level solution. Given the nature of the expected errors due to Tx and Rx clock frequency mismatch, the system and methods in one or more embodiments of this disclosure acquire extra data without significantly lengthening scan acquisition times to be utilized for adjusting the effects of the offsets in the raw data. In an example embodiment, the systems and methods provide a retrospective solution.

One or more of the embodiments in this disclosure relate towards nuclear magnetic resonance inspection equipment. In particular, a MRI scanner for visualizing and post-processing a density distribution of nuclei including relaxation time distributions by measuring induced MR signals from magnetic nuclei such as hydrogen from biological tissues. These phenomena are linked to radiofrequency (RF) coils that are used to generate and/or receive time-varying RF magnetic fields.

Figure 3:
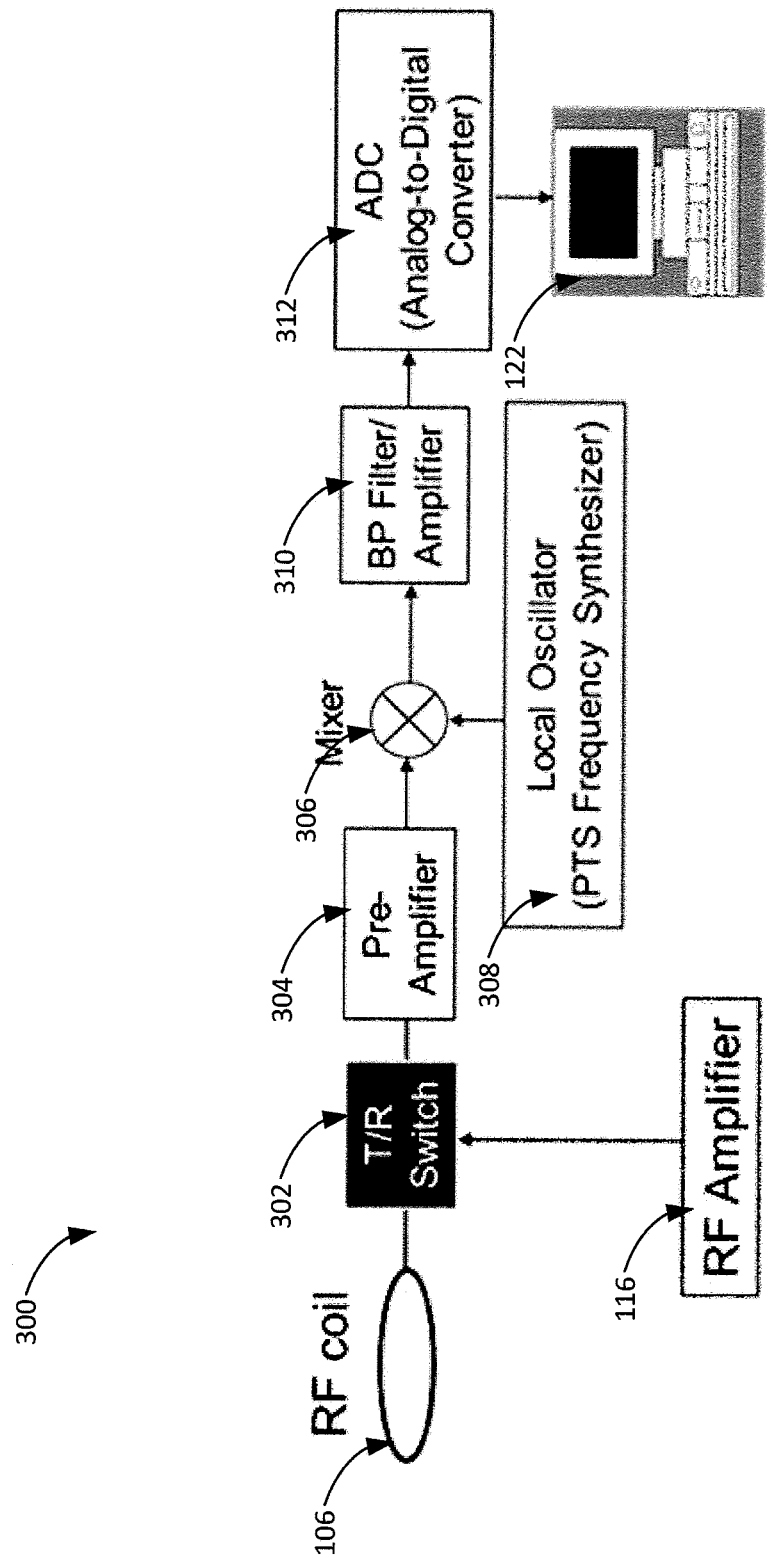
FIG. 3 illustrates a Tx-Rx sub-system in accordance with an embodiment of this disclosure.

FIG. 3 illustrates a Tx-Rx sub-system in accordance with an embodiment of this disclosure. The Tx-Rx sub-system 300 is a part of the MRI system 100. MRI scanners use strong magnetic fields and radio waves to form images of the body. The Tx-Rx sub-system 300 comprises the RF coils 106 and components used to utilize the RF coils 106 and analyze the data received by the RF coils 106. The Tx-Rx sub-system 300 includes components such as, the RF coils 106, RF amplifier 116, computing system 122, a transmitter/receiver (T/R) switch 302, a pre-amplifier 304, a mixer 306, a local oscillator 308 with a PTS frequency synthesizer, a BP filter/amplifier 310, and an analog-to-digital converter 312. The embodiment of the Tx-Rx sub-system 300 shown in FIG. 3 is for illustration only. Other embodiments of a Tx-Rx sub-system could be used without departing from the scope of the present disclosure.

Figure 4:
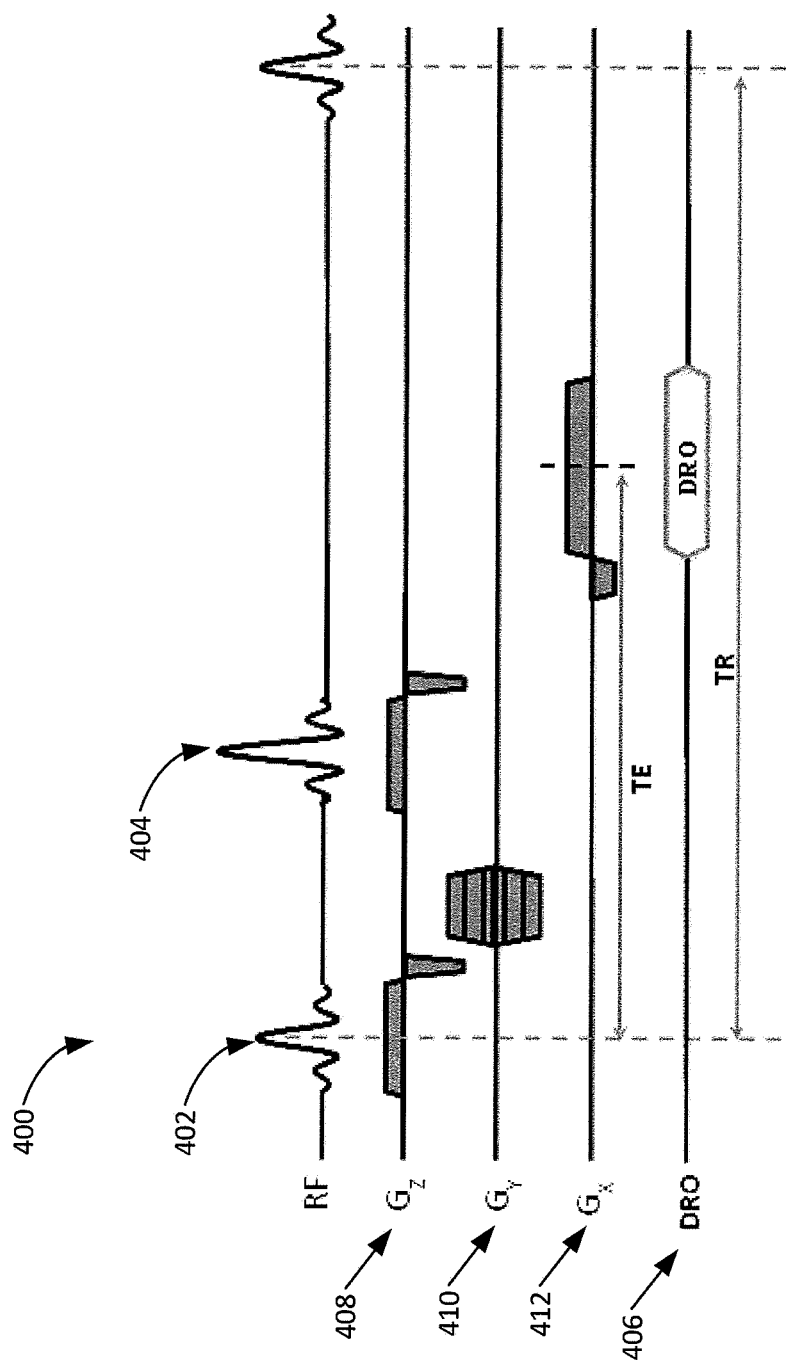
FIG. 4 illustrates a diagram of a 2D spin echo sequence in accordance with an embodiment of this disclosure.
Figure 5:
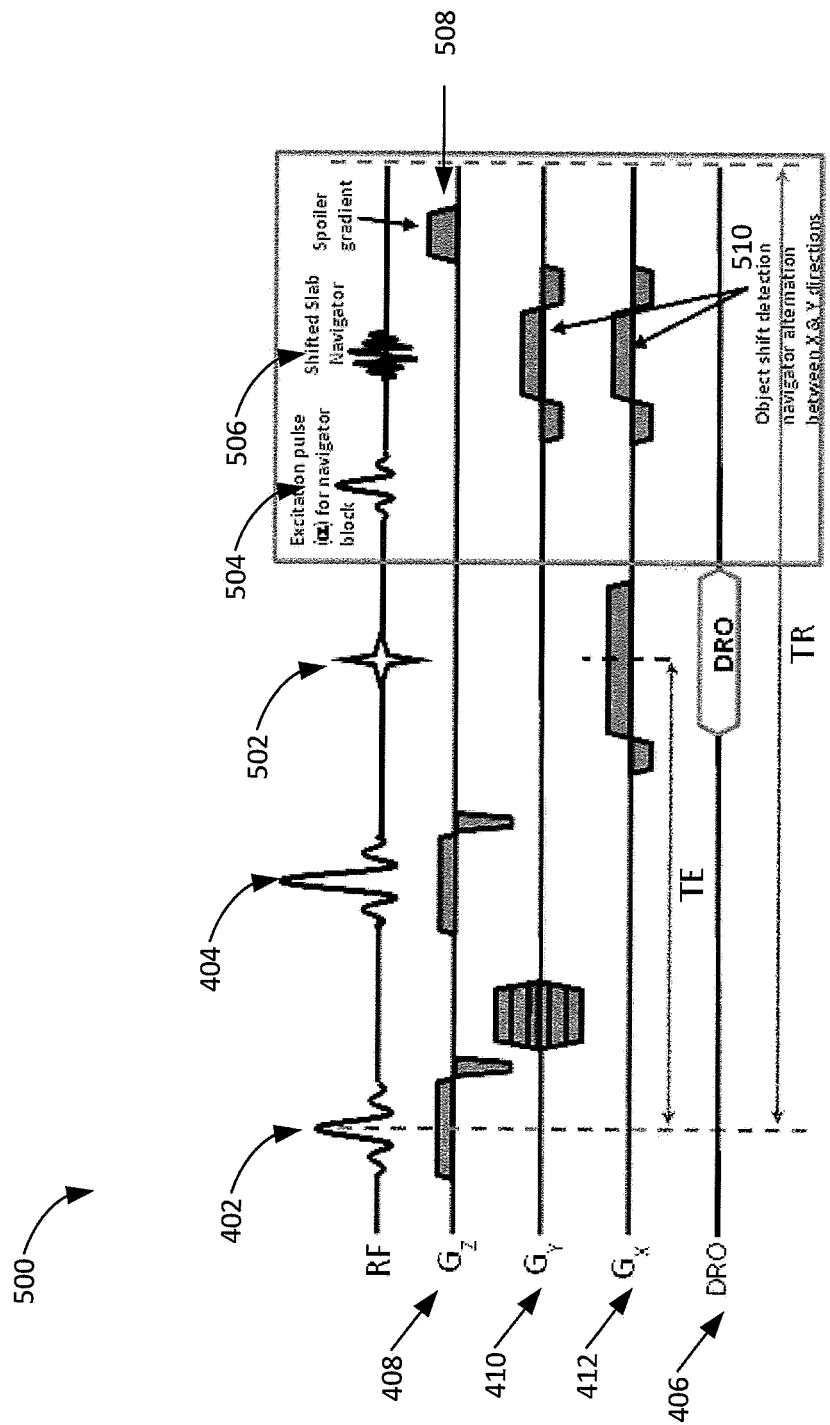
FIG. 5 illustrates a diagram of a spin echo pulse sequence with a navigator module in accordance with an embodiment of this disclosure.

FIG. 4 illustrates a diagram of a 2D spin echo sequence 400 in accordance with an embodiment of this disclosure. The spin echo sequence 400 is made up of a series of events: 90° excitation pulse 402, 180° refocusing pulse 404 at TE/2, and DRO 406 at TE. This series of events is repeated at each time interval TR (Repetition time). With each repetition, a k-space line is filled, according to a variation in the phase encoding gradient. The 180° refocusing pulse 404 compensates for the constant field heterogeneities to obtain an echo that is weighted in T2 and not in T2*. The embodiment of the spin echo sequence 400 shown in FIG. 4 is for illustration only. Other embodiments of a spin echo sequence could be used without departing from the scope of the present disclosure. Additionally, in an example, FIG. 4 includes a spin echo (not depicted) similar to spin echo 502 as shown in FIG. 5.

The gradients include a slice select gradient 408, phase-encoding gradient 410, and frequency-encoding gradient 412. The spin echo sequence 400 shows an example sequence where the 180° refocusing pulse 404 inverts the plane of transverse magnetization thereby reversing time-independent field variations that lead to signal dephasing (as seen in gradient recalled echo or "GRE" imaging). These methods are characterized by the frequency-encoding gradient 412 being switched on during data acquisition causing the resonant frequency to become a function of location. The composite signal is then analyzed by means of a Fourier transform that decomposes signal intensities of distinct frequency components to certain locations.

In the second dimension perpendicular to the frequency-encoding gradient 412, the information about the position of the magnetization vector (phase) is used for encoding spatial information. The phase-encoding gradient 410 is first switched on briefly to establish a difference in phase positions for the magnetization vectors within each voxel in the direction of the magnetic field gradient. This is followed by application of the frequency-encoding gradient 412.

The time between adjacent points (or lines of frequency encoding points) along the phase encode direction is equal to TR since the signal whose T2 is in most cases longer than the 5 to 10 millisecond (ms) readout period, must be reformed in the interval between the accumulation of each readout line in k-space. In an example, the phase encoding gradient can be pulsed briefly, displacing the signal in the Ky or the phase direction in the NMR Fourier space or K-space and the readout process is repeated. The cycle consisting of an excitation followed by phase encode followed by readout is repeated until the desired net displacement (or spatial resolution) along the phase encode axis is achieved. In the conventional K-space diagram, raw data lines are collected one at a time separated by a TR period ranging from 10 ms to 3000 ms. The measurement time is equal to the number of phase encoding steps multiplied by the TR and multiplied by the number of acquisitions (or averages).

In an embodiment, in operational terminology, a spin echo sequence has two essential parameters: TR and TE. TR is the time interval between two successive 90° excitation RF pulses. It conditions the longitudinal relaxation of the explored tissues (depending on T1). The longer the TR, the more complete the longitudinal magnetization regrowth (Mz tends to M0). Reducing TR will weigh the image in T1 as the differences between the longitudinal relaxations of the tissues' magnetization will be highlighted. In classic spin echo, after TR time, a single k-space line will be acquired. TR repetition is thus responsible for the duration of the sequence. TE is the time interval between the 90° flip angle and receipt of the echo, the signal being produced by transverse magnetization. Transverse magnetization decreases according to the time constant T2 of each sample (the field heterogeneities [which contribute to T2*effects] being compensated by the 180° flip angle applied at TE/2).

One or more embodiments of this disclosure recognize and take into account that wireless RF coils afford a more practical solution devoid of many of the aforementioned issues pertaining to cable management. Nonetheless, in a wireless RF coil setup, if the Tx and Rx clocks are not well synchronized or suffer poor synchronization, this can lead to phase encode jitters or offsets in MR images.

One or more embodiments of this disclosure recognize and take into account that in conventional MRIs (using wired RF setups), a Fourier transform analysis of the recorded time domain signal can help recover the magnetization at each frequency or position during the application of gradients. In spatial encoding, an x and a y gradient ($G_x$, $G_y$) are applied to a spin system in order to perform frequency and phase encoding, respectively. The receiver coil spans the extent of the sample and the detected signal S(t) is given by integrating the magnetization given by I(x, y, $z_0$) over the range of x and y positions as, $$S(t)=S(k_x,k_y)=\int_{-\infty}^{+\infty}\int_{-\infty}^{+\infty} I(x,y,z_0)e^{jk_y y}e^{jk_x x}dxdy, \quad (1)$$

where $$k_x=\gamma G_x t, \quad (2)$$

$$k_y=\gamma G_y T_p, \quad (3)$$

and $$(x, y, z_0) = \frac{j\omega_0 \Delta z}{\sqrt{2}} M_{xy}^0(x, y, z_0) B_{1T}(x, y, z_0) e^{-\frac{t}{T_2}}. \quad (4)$$

In the above equations, $k_x$ and $k_y$ are the k-space locations, $T_p$ is the phase encoding duration, $\Delta z$ is the slice thickness, $M_{xy}^0$ is the initial magnetization in the xy plane, $\omega_0$ is a Larmor frequency, and $B_{1T}$ is the RF field strength. In an example, $\omega_0=\gamma B_0$, where $\gamma$ is the gyromagnetic ratio and $B_0$ is the static magnetic field strength.

The clock mismatch can mainly be attributed to a $\Delta t$ term that arises due to a constant offset that is dependent on the frequency offset between the clocks designated for Tx and Rx functions in the wireless RF MRI realm.

The detected signal can now be expressed as, $$S(t+\Delta t) = \int_{-\infty}^{+\infty}\int_{-\infty}^{+\infty} I(x, y, z_0) e^{jk_y y} e^{jk_x x} e^{-\frac{\Delta t}{T_2}} e^{j\gamma G_x \Delta t x} e^{j\gamma B \Delta t} dxdy. \quad (5)$$

The terms that take relaxation and k-space offsets into account with Δt have now been incorporated into equation (5). The term $$e^{-\frac{\Delta t}{T_2}}$$

is related to the offset between the frequency encoding gradient and acquisition window resulting in $T_2$ filtering effects which lead to signal cancellation. The term $e^{j\gamma G_x \Delta tx}$ is also related to the offset between the frequency encoding gradient and acquisition window, but leads to a distortion and deformation of the object shape. This effect is coupled to $$e^{-\frac{\Delta t}{T_2}}$$

above. $e^{j\gamma B \Delta t}$ arises from demodulation and leads to a shift of the object within the field-of-view (FOV).

The signal expression is now rewritten as, $$S(t+\Delta t) = S(k_x', k_y) = \int_{-\infty}^{+\infty} \int_{-\infty}^{+\infty} I'(x,y,z_0) e^{jk_0 y} e^{jk_x' x} e^{j\gamma G_x \Delta tx} e^{j\gamma B \Delta t} dx dy \quad (6)$$

where $$k_x' = \gamma G_x (t+\Delta t) \quad (7)$$

and $$I'(x, y, z_0) = \frac{j\omega_0 \Delta z}{\sqrt{2}} M_{xy}^0(x, y, z_0) B_{1T}(x, y, z_0) e^{-\frac{t+\Delta t}{T_2}}. \quad (8)$$

The term of $$e^{-\frac{\Delta t}{T_2}}$$

is related to the offset between frequency-encoding gradient and acquisition window, resulting in a linear shift along the x direction in the image. The term of $e^{j\gamma G_x \Delta tx}$ is related to the offset between frequency-encoding gradient and acquisition window, resulting in shifts of the k-space center and distortions of the object shape. The term $e^{j\gamma B \Delta t}$ arises from demodulation, and leads to a shift of the object within the field of view.

A common source of error in MRI is subject motion due to translational or rotational displacements during the course of image acquisition. This can be treated as rigid body motion which can occur randomly during the scan. This results in a linear phase shift along x and y. The most straightforward solution for dealing with translational motion is by using navigator echoes where extra data is acquired within a repetition time (TR) to allow tracking object motion which can then be used to recover the phase shifts and correct the image blurring. A navigator echo, or projection signal, may be additional spin or gradient echoes used to monitor changes in the position of the sample during the scan time (TR). A navigator echo may be one type of projection echo, projection signal, interleaved tracking echo, view tracking echo, and/or object projection in 1D, 2D or 3D.

Rigid body translational motion for which all locations of the object undergo identical displacements where the corrupted signal is related to the true signal by $$\tilde{S}(k_x, k_y) = e^{-i\varphi(k_x, k_y)} S(k_x, k_y) \quad (9)$$

where $s(k_x, k_y)$ is the true uncorrupted signal and the phase is given by $$\varphi(k_x, k_y) = 2\pi(k_x \Delta x, k_y \Delta y) \quad (10)$$

Δx and Δy are applied translational phase shifts in the x and y directions, respectively, for each k-space line.

Navigator echoes provide a cost-effective solution for tracking motion and correcting phase shifts. Prior to each view or phase encode, a non-phase encoded projection (navigator) is acquired in the frequency encoding direction. A single navigator projection is selected as a reference and cross correlation functions are determined with respect to each of the other navigator projections. One approach relies on the maximum of cross-correlation which yields the level of displacement with respect to the reference position. At least two navigators must be acquired to view translational motion in two axes.

FIG. 5 illustrates a diagram of a spin echo pulse sequence 500 with a navigator module in accordance with an embodiment of this disclosure. The spin echo sequence 500 is made up of a series of events: the 90° excitation pulse 402, the 180° refocusing pulse 404 at TE/2, the DRO 406 at TE, spin echo 502, navigator pulse 504, and shifted slab navigator signal 506, spoiler gradient 508, and object shift detection navigator 510. This series of events is repeated at each time interval TR. With each repetition, a k-space line is filled, according to a different phase encoding. The embodiment of the spin echo sequence 500 shown in FIG. 5 is for illustration only. Other embodiments of a spin echo sequence could be used without departing from the scope of the present disclosure.

In an embodiment, the sequence 500 has the spin echo 502. The spin echo 502 is the refocusing of spin magnetization by a pulse of resonant electromagnetic radiation. The refocusing can include spin-spin relaxation (T2) and spin-lattice relaxation (T1).

The navigator module with the navigator pulse 504, a separate excitation pulse, and projection readout can be incorporated within the "dead time" afforded in one TR of any pulse sequence. By alternating the x and y projections, 510, between successive TRs, an estimate is obtained of object shifts or phase shifts in each direction and correct k-space locations can be determined. During this time, the shifted slab navigator signal 506 is acquired, received, or read out.

In an embodiment, the spoiler gradient 508 is a magnetic field gradient pulse applied to effectively remove residual transverse magnetization following the projection signal by producing a rapid variation of its phase along the direction of the gradient.

One or more embodiments include hardware-independent solutions that involve the acquisition of navigator echoes as an additional data acquisition module within each TR of the sequence. This solution will enable correction of errors arising from both, phase and frequency mismatch in the wireless RF realm. The navigator technique is widely used to track and correct translational subject-induced motion during MRI scans. Here, these echoes can be used to track the linear phase shifts in k-space and the overall skew, a consequence of TR mismatch between transmit and receive clocks in wireless RF coil implementations.

Figure 6:
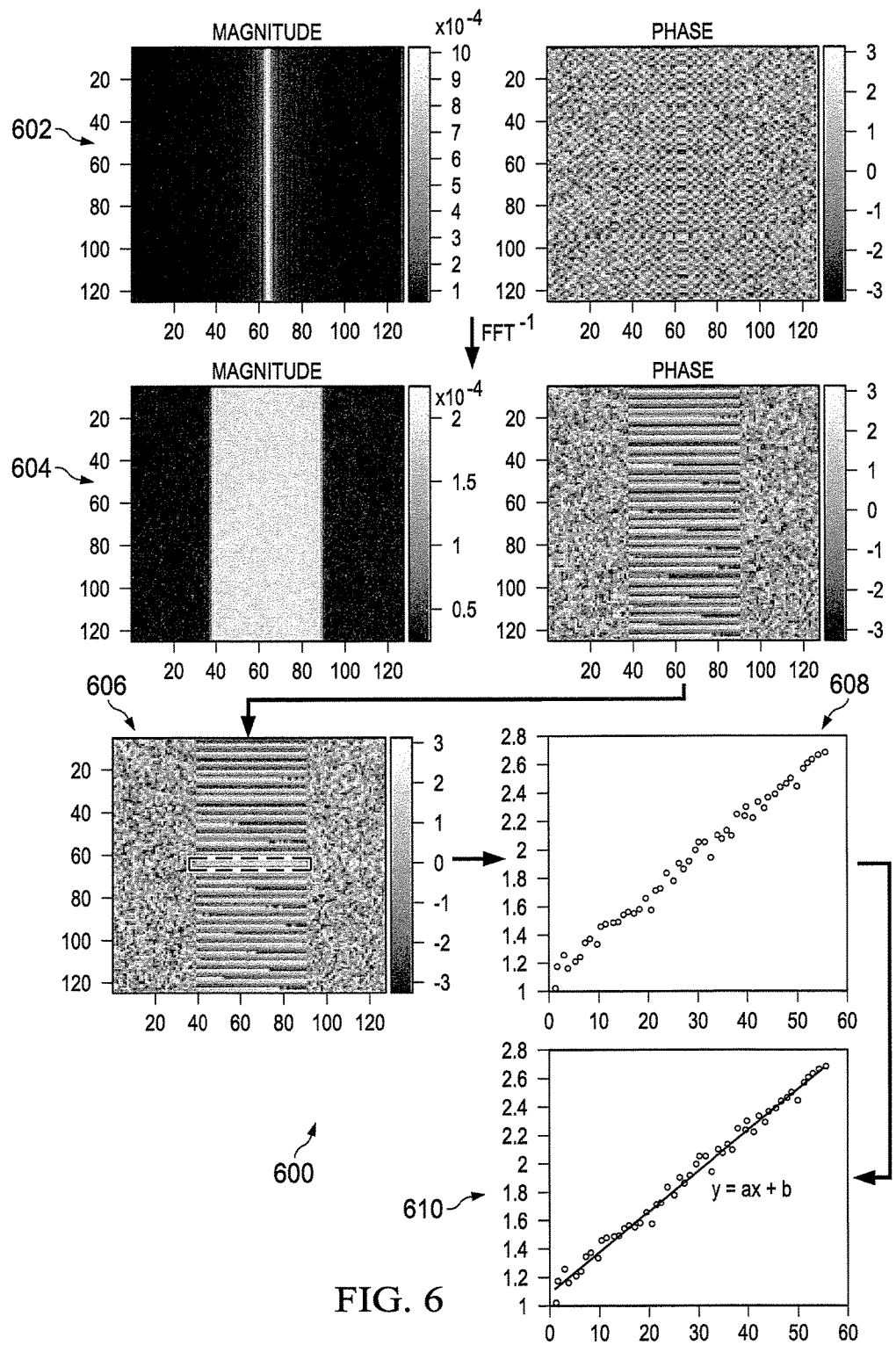
FIG. 6 illustrates a process for navigator echo based correction of a clock mismatch according to an embodiment of this disclosure.

FIG. 6 illustrates a process 600 for navigator echo based correction of a clock mismatch according to an embodiment of this disclosure. The clock mismatch effects arising from linear shifts and a k-space skew. The embodiment of the process 600 shown in FIG. 6 is for illustration only. Other embodiments of the process 600 could be used without departing from the scope of the present disclosure.

The process 600 includes operations associated with navigator echo based correction of clock mismatch effects in MR wireless coil implementations. Following a 1D inverse Fourier transformation, a navigator phase profile is obtained per navigator echo, which relays the response of the transverse (x-y) magnetization vector for each (alternating) projection along x and y per TR. Each navigator phase profile obtained can be incorporated into a linear regression from which a slope or phase estimator can be recovered. A collection of such estimates can then be used to identify the maximum k-space shift and permit correction of such shifts globally over the k-space data.

At operation 602, a controller is configured to identify magnitude and phase representation of the navigator signal in k-space. At operation 604, the controller is configured to perform an inverse Fourier transformation of the navigator magnitude and phase to obtain image domain based representations. At operation 606, the controller is configured to select a phase in the image domain based representation. At operation 608, the controller is configured to plot a linear regression of the selected phase. At step 610, the controller is configured to calculate a slope or phase estimator ($\Delta \hat{K}_x^1$) from the linear regression. A collection of such navigator estimates, $\Delta \hat{K}_x^1$, $\Delta \hat{K}_x^2$, $\Delta \hat{K}_x^L$, etc. can be used to identify the maximum k-space shift according to the relationship below:

$$\Delta \hat{K} = \frac{1}{L} \sum_{i=1}^{L} \frac{L-1}{l} \Delta \hat{K}_x^l \quad (10)$$

Process 600 permits a correction of the skew or shifts resulting from Tx and Rx clock mismatch in the wireless RF coil implementations.

Figure 7A:
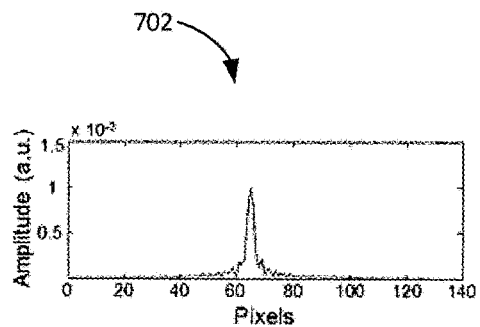
FIGS. 7A-7E illustrate a process for identifying an image shift and remedying such shifts in accordance with an embodiment of this disclosure.

FIGS. 7A-7E illustrate a process for identifying an image shift and remedying such shifts in accordance with an embodiment of this disclosure. FIG. 7A illustrates a diagram 702 of a navigator echo signal in the center k-space line.

Figure 7B:
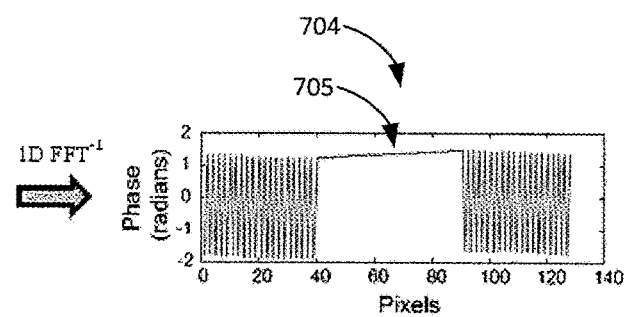

FIG. 7B illustrates a diagram 704 with a slope 705 from a simulated navigator phase profile after 1D inverse FFT of 702. This results from object shifts or displacements during the course of a scan. The slope 705 is analogous to what would be observed and correlates with linear phase shifts in k-space as a result of clock frequency mismatch owing to a mismatch from TR to TR in conventional scans where wireless RF coils are used.

Figure 7C:
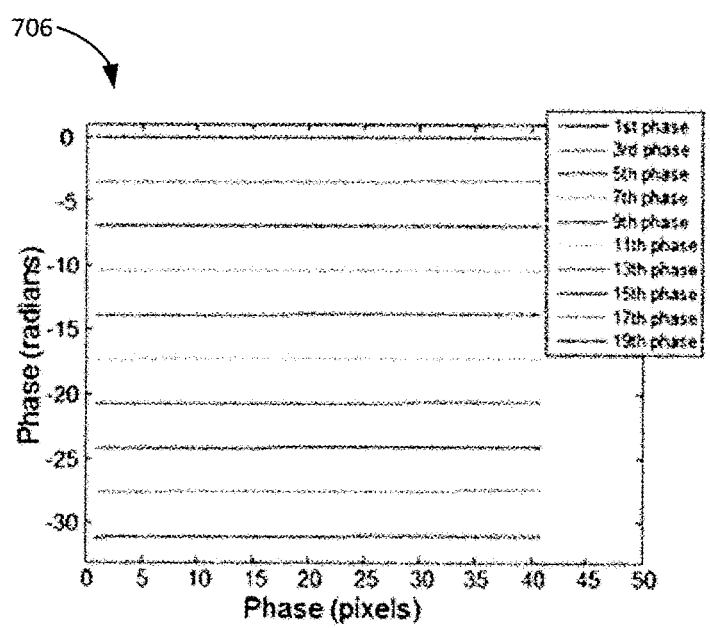
Figure 7D:
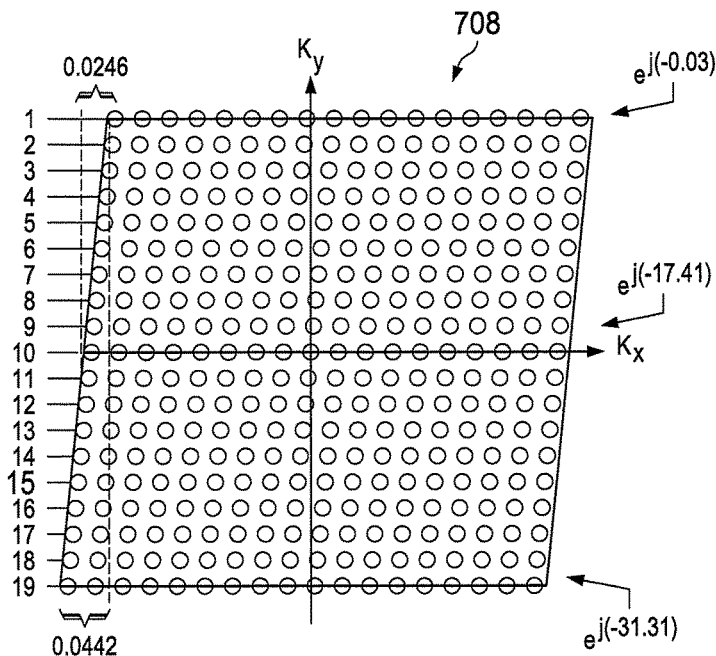
Figure 7E:
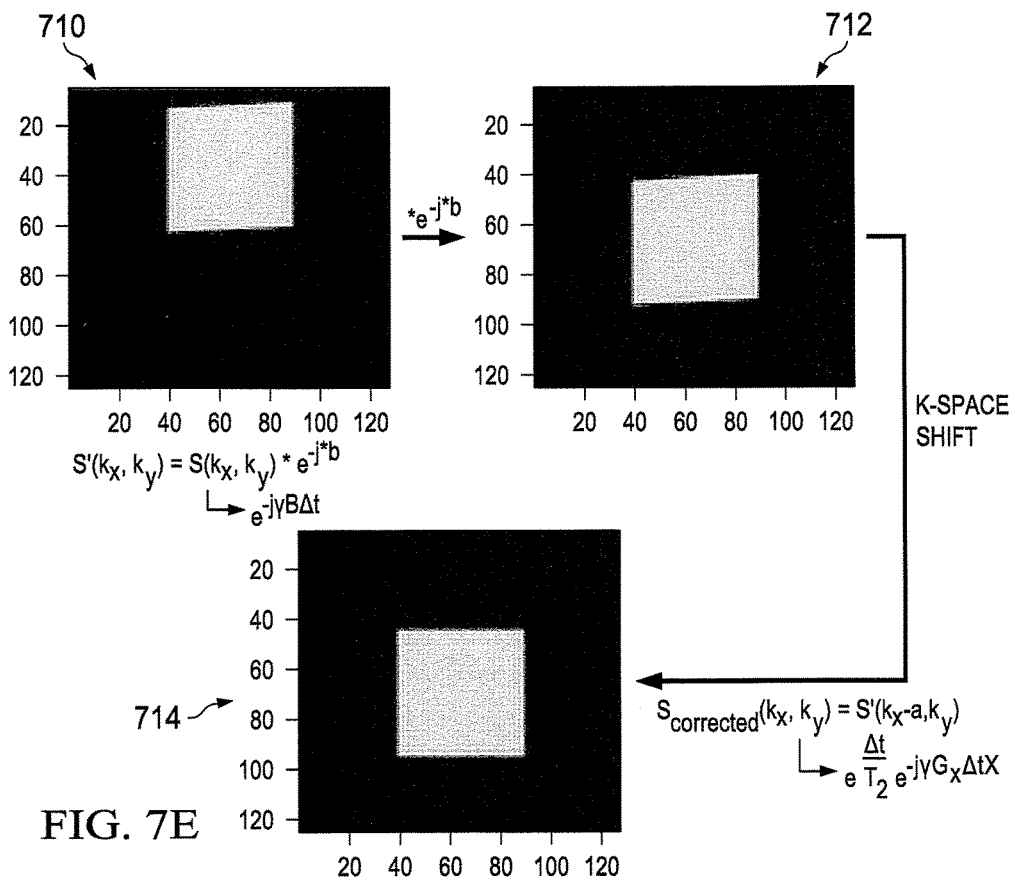

FIG. 7C illustrates a collection 706 of ten navigator phase profiles is shown that yield the slopes associated with shifts from TR to TR. These profiles correlate with the shifted k-space lines from which the slope or the amount of the shift and also the intercept or starting k-space points can be recovered by means of a linear equation of the form, y=ax+b. The actual slope and intercept values for the aforementioned ten navigator phase profiles are given in Table 1. Based on these slope and intercept values for each navigator phase profile, a correction of every k-space line (or globally over the entire k-space skew) can be performed to generate artifact free images as shown in FIGS. 7D-7E.

TABLE 1

Slope and intercept values for ten select navigator phase profiles shown in FIG. 7C.

| Navigator phase profile | Slope (rad/cm) | Intercept (rad) |
|---|---|---|
| 1 | 0.0000 | −0.03 |
| 3 | 0.0050 | −3.51 |
| 5 | 0.0099 | −6.98 |
| 7 | 0.0148 | −10.46 |
| 9 | 0.0197 | −13.94 |
| 11 | 0.0246 | −17.41 |
| 13 | 0.0295 | −20.89 |
| 15 | 0.0344 | −24.36 |
| 17 | 0.0393 | −27.84 |
| 19 | 0.0442 | −31.31 |

FIG. 7D illustrates an effect of linear phase shift on a k-space sub-sample 708 of nineteen readouts. Slopes and phase values for lines 1, 11 and 19 are displayed from Table 1.

FIG. 7E illustrates a process for image correction using navigator echoes. The k-space skew as seen in FIG. 7D results in a shift and distortion of the object in the image domain. The object, in image 710, can first be re-centered in the field-of-view by multiplying the k-space signal by the intercept or starting point obtained from the navigator phase profiles in image 712. Next, the slope also obtained from the navigator phase profiles is used to recover the k-space skew or offsets along the phase-encoding axis due to mismatches between the frequency encoding gradient and the acquisition window in image 714. This second correction adjusts the phase errors that stem from the combined effects of linear phase shift and T2 filtering effects.

Figure 8:
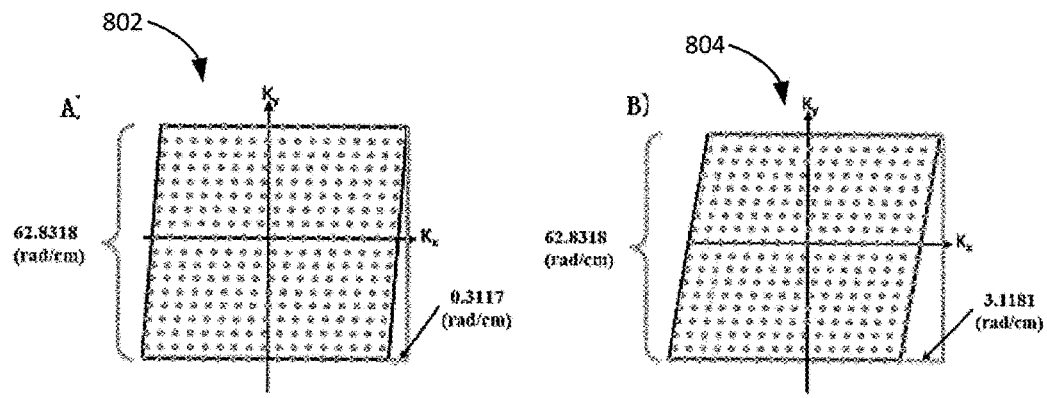
FIG. 8 illustrates different levels of skew correction in k-space and k-space via navigator echoes in accordance with an embodiment of this disclosure.

FIG. 8 illustrates different levels of skew correction in k-space 802 and k-space 804 via navigator echoes in accordance with an embodiment of this disclosure. The navigator echoes are acquired for two different frequency mismatch conditions differing by one order of magnitude (100 ppb in k-space 802 vs. 1 ppm in k-space 804) at 3T. For the examples shown, the k-space starting points or the intercepts also differ by an order of magnitude (0.312 in k-space 802 vs. 3.12 rad/cm in k-space 804).

Figure 9:
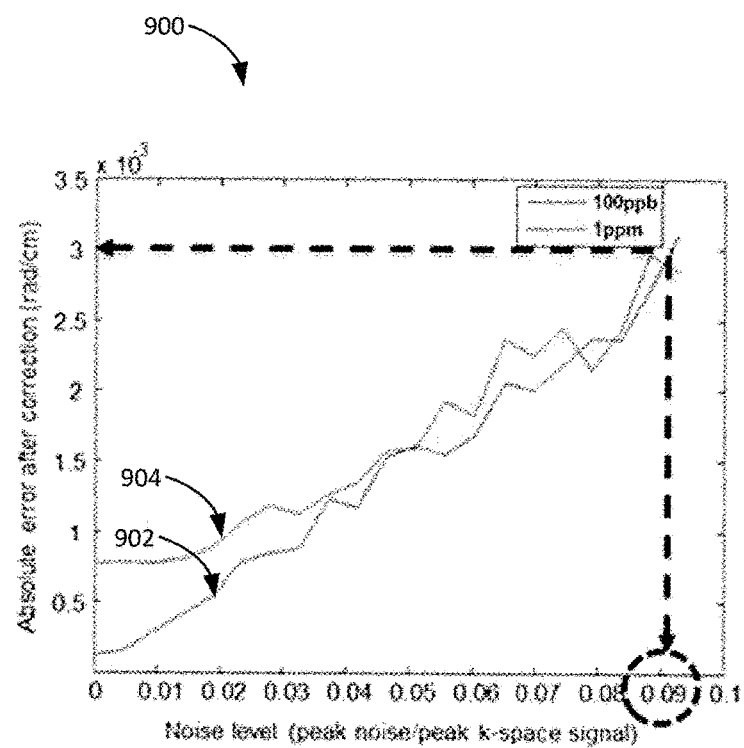
FIG. 9 illustrates a plot of the noise level against an absolute error following navigator echo-based corrections of k-space skews from two sample frequency mismatch conditions (100 ppb and 1 ppm) over several noise levels defined as peak noise over peak k-space signal in accordance with an embodiment of this disclosure.

FIG. 9 illustrates a plot of the noise level against an absolute error following navigator echo-based corrections of k-space skews from two sample frequency mismatch conditions (100 ppb and 1 ppm) over several noise levels defined as peak noise over peak k-space signal in accordance with an embodiment of this disclosure. The data in chart 900 shows that the corrections are independent of the level of frequency mismatch owing to the juxtaposition of curves 902 for 100 ppb and 904 for 1 ppm. Further, even at high noise levels (e.g. 9%), the navigator echo-based correction approach yields robust results based on the absolute error of 0.003 at that noise level. Ideally, Tx and Rx clocks with a frequency mismatch of ~100 ppb would ensure a minimal offset and thereby result in lower error rates following navigator echo corrections.

Figure 10:
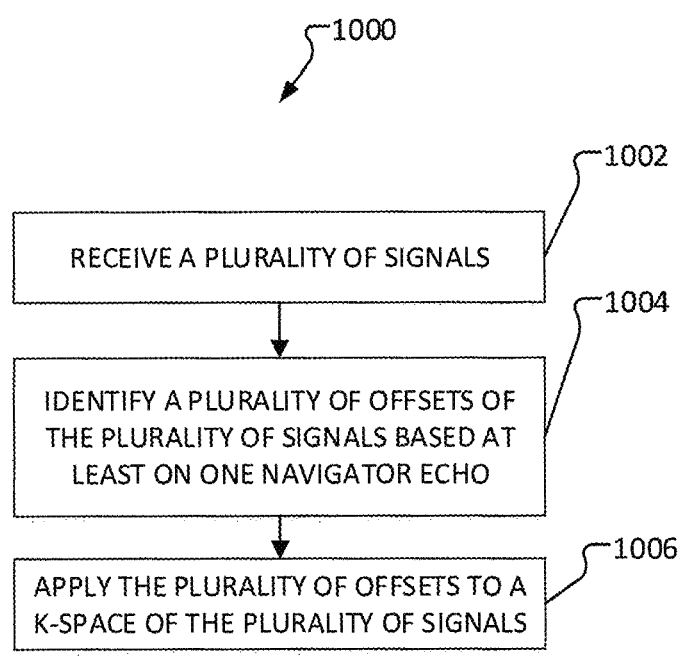
FIG. 10 illustrates a process for correcting an MRI image in accordance with an embodiment of this disclosure.

FIG. 10 illustrates a process 1000 for correcting an MRI image in accordance with an embodiment of this disclosure. The controller here may represent the processing device 210 and the memory element may be the memory 230 in FIG. 2. The embodiment of the process 1000 shown in FIG. 10 is for illustration only. Other embodiments of the process 1000 could be used without departing from the scope of this disclosure.

At operation 1002, a controller is configured to execute a set of instructions to receive data of a plurality of signals. The plurality of signals comprise at least one navigator echo.

At operation 1004, the controller is also configured to identify a plurality of offsets of the plurality of signals based on the at least one navigator echo. The term $$e^{-\frac{\Delta t}{T_2}}$$

is related to the offset between the frequency-encoding gradient and acquisition window resulting in $T_2$ filtering effects which lead to signal cancellation. The term $e^{j\gamma G_x \Delta t x}$ is also related to the offset between the frequency-encoding gradient and acquisition window, but leads to a distortion and deformation of the object shape. This effect is coupled to $$e^{-\frac{\Delta t}{T_2}}$$

above. The term $e^{j\gamma B \Delta t}$ arises from demodulation and leads to a shift of the object within the field-of-view (FOV).

In an embodiment, the offsets are calculated from a slope of a phase profile of at least one navigator echo.

At operation 1006, the controller is also configured to apply the plurality of offsets to a k-space of the plurality of signals.

In an example embodiment, the systems and methods herein may provide for using the clock synchronization methods used in wireless communication systems with microsecond level accuracy may provide a useful solution here. Also, RF pulses can be used as clock sync signals without incorporating additional hardware into the setup schemes.

In an example embodiment, the systems and methods herein may provide for using highly stable accurate clock source (TCXO/OCXO) yielding around 100 ppb stability in the wireless RF coil.

In an example embodiment, the systems and methods herein may provide for estimators that can be substituted with other estimation techniques, e.g. Maximum Likelihood Estimators based on different noise models.

An alternative image post-processing approach involves utilizing a self-navigated technique where no additional data is acquired but correlations between successive k-space lines are performed to determine linear phase shifts from line to line in k-space.

The proposed navigator echo-based correction is immediately applicable to any wireless RF coil setup where frequency offsets can exist between transmit and receive RF functions during an MRI scan. It offers a relatively straightforward retrospective solution and the corrections can be performed on board to output the error or artifact free image data.

One or more embodiments provide that navigator echoes are one of the most straightforward approaches from which the linear phase shifts in the form of displacements along x and y can be recovered.

Additionally, one or more embodiments of this disclosure recognize and take into account that motion degradation on MR images can be attributed to macroscopic motion that encompasses both physiologic motion from respiratory, cardiac pulsations, or peristalsis, and involuntary subject movement during the scan. The latter effects are the main source resulting in loss of image sharpness. The problem is only exacerbated when one needs to acquire high-resolution data (on the order of microns) where subject movement on the order of millimeters affects the high-resolution data. The many correction methods for rigid body motion rely on detection of the pose changes that need to be decoupled from the correction routine.

One or more embodiments of this disclosure provide a system of implementing a set of miniature MRI wireless coils that serve as motion trackers for a prospective motion detection. Additionally, novel pulse sequences and motion correction algorithms also serve as features of this invention. The RF coils would function as additional set of coils (apart from the main imaging receive coils) solely for the purpose of motion detection by Faraday's principle of induction.

One or more embodiments of this disclosure provide smaller motion tracking wireless coils that will be positioned closer to the tissue or anatomical region being scanned thereby providing more accurate motion degradation information in the course of a routine scan. Additionally, FID navigator based pulse sequences will be incorporated for motion detection. In this prospective approach, motion-degraded data or lines of k-space can be reacquired, as real-time FID data acquired as part of the main scan can alert the user to ongoing subject-induced motion.

One or more embodiments of this disclosure provide that by positioning the wireless miniature RF coils closer to the subject (rather than on an accessory for a specific anatomical region), motion degraded data can be picked up more accurately from several distinct anatomical locations undergoing MR scanning. Also, the FID navigator approach has the potential to rapidly detect corrupted data points and reacquire them before the entire main scan is completed.

Wireless RF coils, either as a single loop coil or solenoid, can be integrated into a primary wired or wireless RF receive (Rx) coil setup to enable prospective motion detection and correction. They can be referred to "RF motion taggers". A few of these coils are strategically placed on the subject near the Rx coil arrays. Their signal is linked wirelessly to the receive array by Faraday's law of mutual induction (inductive coupling (magnetic flux, dΦ/dt)). During the signal reception, the wireless RF motion taggers pick up signal in the vicinity. This signal generates a current dI/dt in the tagger and an associated magnetic field and flux as it passes through the imaging coil. The flux induces a voltage, V in the main RF coil that gets routed to the standard receiver.

One or more embodiments of this disclosure provide that novel pulse sequences based on a navigator approach can be used to prospectively update the orientation and position of the imaging volume so that it follows the patient or identifies motion-degraded portions of the data during the course of the acquisition and removes those data prior to image reconstruction or reacquires only that part which is degraded.

Rigid body motion can be monitored by changes in the free induction decay or FID signal over time in coil arrays. FID signals from local coil elements change as a function of object distance. The local coil sensitivities are being used from multi-channel coils to detect motion displacements during the course of the scan. If the object is sufficiently covered with the coil elements, the inverse problem of back-calculation of the rigid body motion parameters is then solvable.

For the FID navigators, in terms of the signal combination steps to detect motion and how much of it occurred, in a given pulse sequence such as the magnetization prepared rapid gradient echo (MP-RAGE), the first three repetition times (TRs) can be skipped since the longitudinal magnetization is building up there. Reference values (one per coil) may also be calculated. In equation 11 below, "t" is the repetition number, N, number of coil elements, and $nav_i(t)$ is the complex navigator data of coil element I in repetition number t. The number of incoming navigators is dependent on the number of coil elements for signal reception. For the implementation in one or more embodiments of this disclosure, the number of incoming navigators could be as low as three. Percental complex magnitude of the navigator signal could be calculated. It can yield a single value that can now be tracked over time.

$$\Delta(t) = \frac{1}{N} \sum_{i=1}^{N} \frac{|nav_i(t) - ref_i|}{|ref_i|} \quad (11)$$

Figure 11:
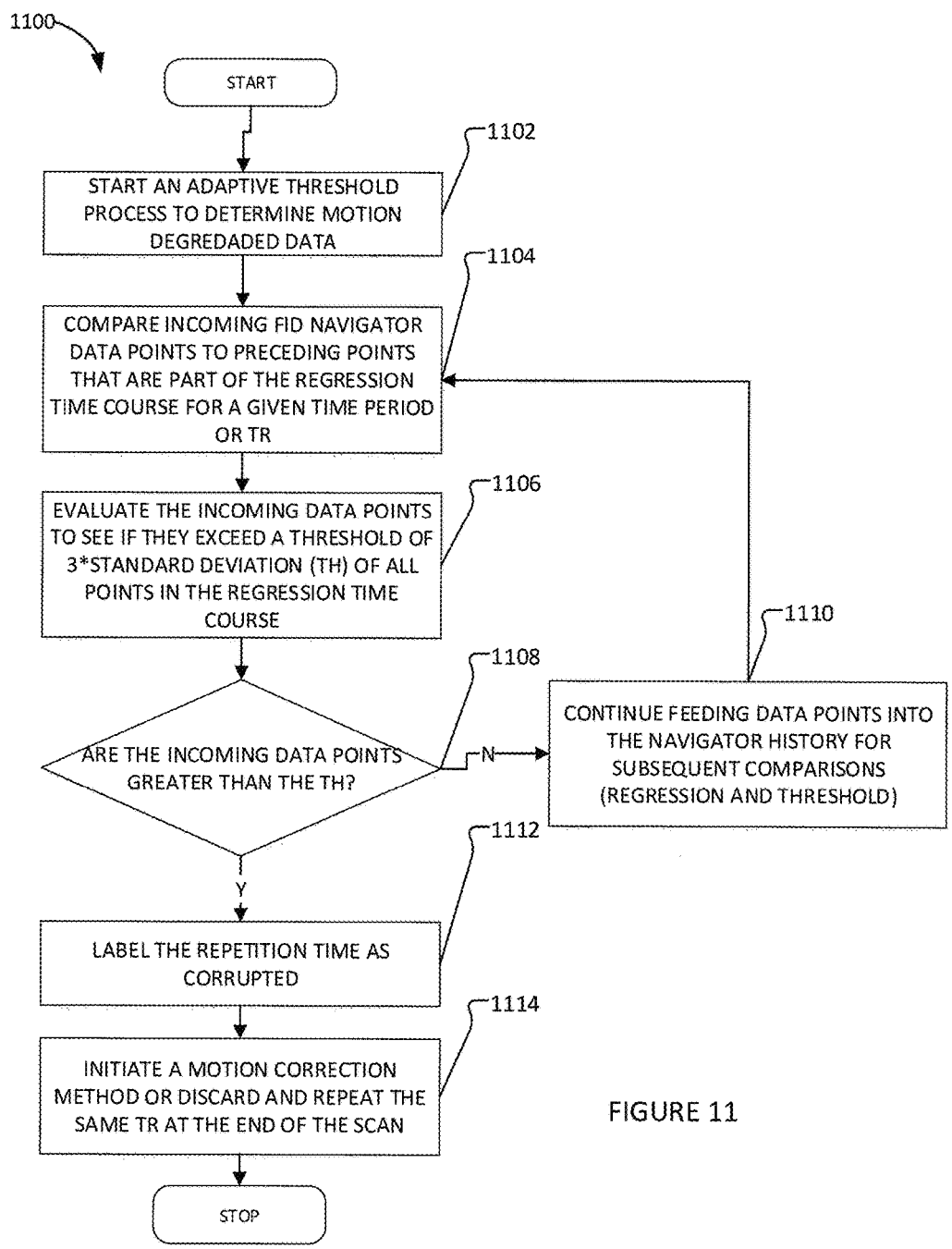
FIG. 11 illustrates a motion detection process in accordance with an embodiment of this disclosure.

FIG. 11 illustrates a motion detection process 1100 in accordance with an embodiment of this disclosure. A cause of motion degradation is involuntary subject motion that leads to either a linear phase shift of the k-space views or lines for translational motion or a rotation of the same k-space lines in the case of rotational motion. Both types of motion degradations can result in blurring and loss of sharpness in the image domain. The controller here may represent the processing device 210 and the memory element may be the memory 230 in FIG. 2. The embodiment of the process 1100 shown in FIG. 11 is for illustration only. Other embodiments of the process 1100 could be used without departing from the scope of this disclosure.

At operation 1102, the controller is configured to start an adaptive threshold process to determine motion degraded data. In an example, operation 1102 is performed by evaluating the incoming navigator point history, a collection of FID navigator signals or data points acquired per repetition time (TR). At operation 1104, the controller is configured to the compare incoming FID navigator data points, $\Delta(n)$, to preceding points that are part of the regression time course for a given time period or TR. The regression time course is a plot of the navigator data points that is updated in real-time with each incoming signal or data point.

At operation 1106, the controller is configured to evaluate incoming data points to see if they exceed the threshold of 3*std. deviation (TH) of all points in the regression time course. In an example embodiment, the controller may also be configured to determine the threshold and isolate that from other effects such as heating that may occur due to lengthy scans. Also, frequency shifts can be addressed that can cause drifts and changes in signals over time. A nominal threshold of three standard deviations of the points can be assigned (implying that it is outside a 99.7% confidence interval for a normal distribution). A more relaxed threshold entailing higher number of standard deviations, such as, for example but not limited to, 4*std. deviations or more can be used based on the imaging application being performed.

At operation 1108, the controller is configured to determine whether the incoming data points are greater than the threshold. If not, at operation 1110, the controller is configured to continue feeding data points into the navigator history for subsequent comparisons to the regression time course and for updating the adaptive threshold process. If equal or above the threshold, at operation 1112, the controller is configured to label the TR or k-space line as motion-corrupted.

If above the threshold, at operation 1114, the controller is configured to initiate a motion correction method or discard and repeat the same TR at the end of the scan. A corrupted k-space line or set of corrupted lines can be re-acquired at the end of the scan. In this example, the basic assumption is that subject may have moved the anatomy of interest being scanned back to the original position where it was at the start of the scan.

Other techniques such as floating navigators and self-navigated techniques can also be investigated and potentially be incorporated with this standalone hardware solution based on miniature RF taggers for motion detection and correction.

The embodiments of this disclosure are not relegated to a certain anatomical location and can be applied to any anatomical region with any type of primary RF coil (wired or wireless) for motion tracking.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. An apparatus, comprising:
a memory element; and
a controller coupled to the memory element, the controller configured to execute a set of instructions to:
receive data of a plurality of signals, the plurality of signals comprising at least one projection echo, wherein the at least one projection echo is acquired without applying a phase-encoding gradient,
identify a plurality of offsets of the plurality of signals based on the at least one projection echo, and
apply the plurality of offsets to a k-space of the plurality of signals.

2. The apparatus of claim 1, wherein the plurality of signals are received at a plurality of radiofrequency coils.

3. The apparatus of claim 1, wherein the plurality of offsets comprise phase and frequency offsets.

4. The apparatus of claim 1, wherein an offset of the plurality of offsets is between a frequency encoding gradient and an acquisition window.

5. The apparatus of claim 1, wherein an offset of the plurality of offsets is demodulation of the plurality of signals.

6. The apparatus of claim 1, wherein the controller configured to execute a set of instructions to identify a plurality of offsets of the plurality of signals based on the at least one projection echo comprises instructions to:
apply a one-dimensional inverse Fast Fourier transform to an amplitude of the at least one projection echo; and
identify a slope in the Fast Fourier transformed amplitude corresponding to at least one projection echo phase profile.

7. The apparatus of claim 4, wherein the offset is calculated by:

$$e^{-\frac{\Delta t}{T_2}},$$

wherein $\Delta T$ is a change in time and $T_2$ is a spin-spin relaxation time.

8. The apparatus of claim 4, wherein the offset is calculated by:
$e^{j\gamma G_x \Delta t x}$, wherein $\Delta t$ is a change in time and $G_x$ is a frequency encoding gradient.

9. The apparatus of claim 5, wherein the offset is calculated by:
$e^{j\gamma B \Delta t}$, wherein $\Delta t$ is a change in time and B is a radio frequency field strength.

10. A method, comprising:
receiving data of a plurality of signals, the plurality of signals comprising at least one projection echo, wherein the at least one projection echo is acquired without applying a phase-encoding gradient,
identifying a plurality of offsets of the plurality of signals based on the at least one projection echo, and
applying the plurality of offsets to a k-space of the plurality of signals.

11. The method of claim 10, wherein the plurality of signals are received at a plurality of radiofrequency coils.

12. The method of claim 10, wherein the plurality of offsets comprise phase and frequency offsets.

13. The method of claim 10, wherein an offset of the plurality of offsets is between a frequency encoding gradient and an acquisition window.

14. The method of claim 10, wherein an offset of the plurality of offsets is demodulation of the plurality of signals.

15. The method of claim 10, wherein identifying a plurality of offsets of the plurality of signals based on the at least one projection echo comprises:
applying a one-dimensional inverse Fast Fourier transform to an amplitude of the at least one projection echo; and
identifying a slope in the Fast Fourier transformed amplitude corresponding to at least one projection echo phase profile.

16. The method of claim 13, wherein the offset is calculated by:

$$e^{-\frac{\Delta t}{T_2}},$$

wherein $\Delta t$ is a change in time and $T_2$ is a spin-spin relaxation time.

17. The method of claim 13, wherein the offset is calculated by:
$e^{j\gamma G_x \Delta t x}$, wherein $\Delta t$ is a change in time and $G_x$ is a frequency encoding gradient.

18. The method of claim 14, wherein the offset is calculated by:
$e^{j\gamma B \Delta t}$, wherein $\Delta t$ is a change in time and B is a radio frequency field strength.

19. A non-transitory computer-readable storage medium comprising logic, stored on the computer-readable storage medium for execution on a plurality of processors, for:
receiving data of a plurality of signals, the plurality of signals comprising at least one projection echo, wherein the at least one projection echo is acquired without applying a phase-encoding gradient,
identifying a plurality of offsets of the plurality of signals based on the at least one projection echo, and
applying the plurality of offsets to a k-space of the plurality of signals.

20. The non-transitory computer-readable storage medium of claim 19, wherein the logic for identifying a plurality of offsets of the plurality of signals based on the at least one projection echo comprises logic for:
applying a one-dimensional inverse Fast Fourier transform to an amplitude of the at least one projection echo; and
identifying a slope in the Fast Fourier transformed amplitude corresponding to at least one projection echo phase profile.

* * * * *